United States Patent [19]

Garrett et al.

[11] Patent Number: 4,499,673
[45] Date of Patent: Feb. 19, 1985

[54] REVERSE VOLTAGE CLAMP CIRCUIT

[75] Inventors: William G. Garrett, Canton; Karl W. Overberg, Dearborn, both of Mich.

[73] Assignee: Ford Motor Company, Dearborn, Mich.

[21] Appl. No.: 472,502

[22] Filed: Mar. 7, 1983

[51] Int. Cl.³ .............................................. H02H 9/04
[52] U.S. Cl. ........................................ 361/56; 361/91
[58] Field of Search ............... 361/56, 88, 91, 92, 361/18

[56] References Cited

U.S. PATENT DOCUMENTS

| | | | |
|---|---|---|---|
| 4,085,432 | 4/1978 | Varettoni | 361/91 |
| 4,302,792 | 11/1981 | Harwood | 361/92 |
| 4,306,185 | 12/1981 | Leuschner | 361/18 X |

Primary Examiner—Harry E. Moose, Jr.
Attorney, Agent, or Firm—Peter Abolins; Robert D. Sanborn

[57] ABSTRACT

A reverse voltage clamp circuit prevents the collector of an output transistor from substantially crossing a reference voltage near ground potential. The collector of the output transistor is coupled to the emitter of a clamping transistor which has its collector connected to a voltage source through a diode. The base of the clamping transistor is connected through another diode to a reference voltage of a magnitude to prevent the collector of the grounded-emitter output transistor from crossing the ground reference voltage.

10 Claims, 5 Drawing Figures

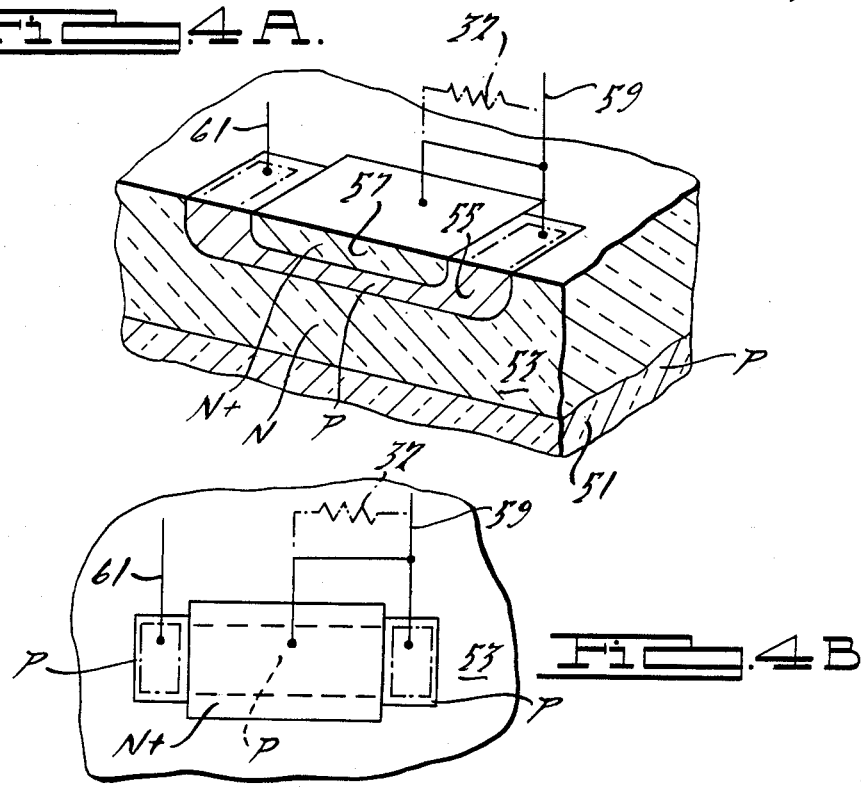
FIG. 4A.
FIG. 4B.
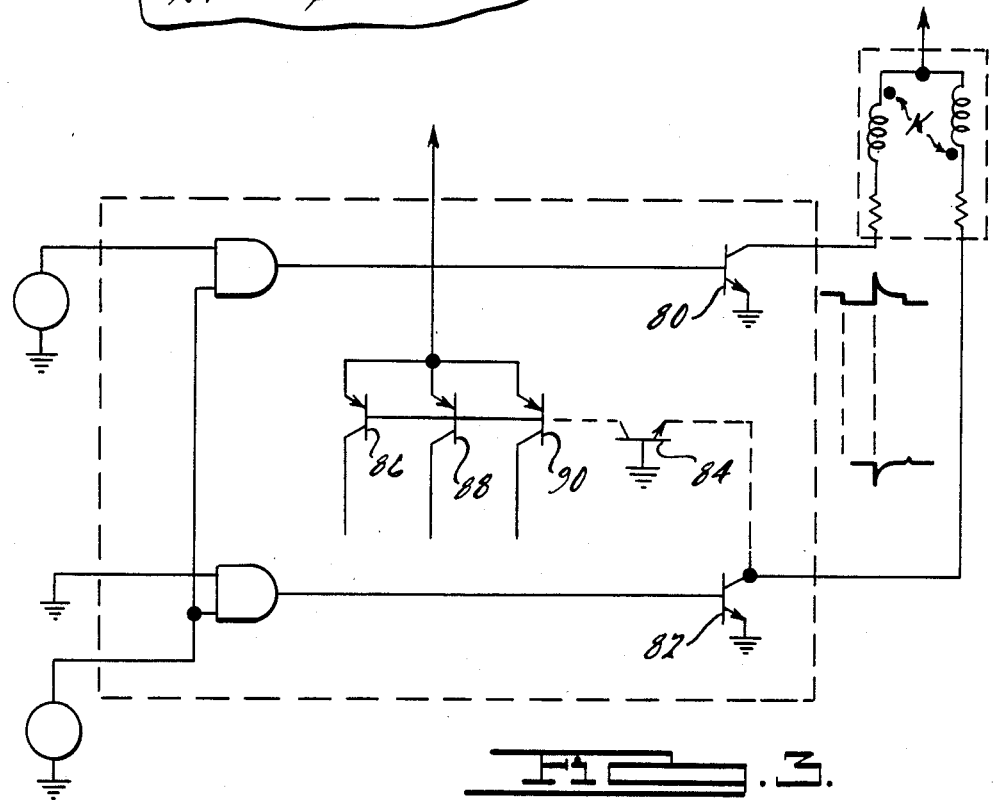
FIG. 3.

4,499,673

REVERSE VOLTAGE CLAMP CIRCUIT

BACKGROUND OF THE INVENTION

1. Field of the Invention

This invention relates to limiting reverse voltage swings at output stages of integrated circuits.

2. Prior Art

When a common emitter NPN driver transistor is formed in an epitaxial integrated circuit, there is a parasitic NPN formed whose emitter is the collector of the driver transistor, whose base is the P-type substrate, and whose collector is any other N-type epitaxial region on the integrated circuit. Thus, when the output of a circuit is an open collector NPN driver transistor, it is undesirable that external influences cause the voltage at the output to fall significantly below the ground (substrate) reference voltage. Such a decrease in output voltage can turn on the parasitic NPN transistor, injecting unwanted minority carriers into the substrate which will be collected by adjacent epitaxial regions. This collected current can be particularly disruptive if the adjacent epitaxial region is the base of a lateral PNP transistor or the collector of an NPN transistor. Clamping the output of the open collector NPN driver transistor to a voltage level close to the ground reference voltage prevents undesirable crosstalk due to minority carrier injection into the substrate.

A known way of overcoming this parasitic coupling of undesirable signals is to connect a low impedance diode between the emitter and collector of the output driver transistor so that the negative voltage swing is clamped by the diode and does not turn on the parasitic NPN transistor. However, a drawback to such a system is that the diode must be a large size to absorb typical output transients and it does not completely prevent the parasitic NPN transistor from turning on, but only reduces its current flow. Thus, to the extent that the parasitic NPN turns on, there is still undesired coupling from the driver transistor collector into adjacent and nonadjacent N-type epitaxial layer regions. Such regions typically include the collectors of other NPN transistors, the bases of other PNP transistors, and resistor tubs.

A particular problem caused by such parasitic current is that transistors adjacent to output transistors, which may be controlling other drivers, may turn on and cause an undesirable output. If the output transistors are connected to a motor, undesired actuation of various motor coils could cause motor stalling, hesitating or jerking.

SUMMARY OF THE INVENTION

A reverse voltage clamp circuit for clamping the output of an open collector output transistor close to a ground reference voltage means. The clamping transistor has an emitter coupled to the collector of the output transistor. A first diode is coupled to the base of the clamping transistor. A second diode is coupled between the collector of the clamping transistor and a voltage source for preventing destructive emitter-base breakdown in the clamping transistor in case the output is pulled substantially above the voltage source. The reference voltage means is coupled to the voltage source, to the ground reference, and to the first diode for establishing a reference voltage at the input to the first diode so as to keep the collector of the output transistor from swinging significantly below the ground reference voltage.

This protection circuit is effective in keeping the parasitic NPN transistor across an output transistor turned off. Such an extremely simple configuration provides fast operation and effectiveness at clamping extremely large reverse surge transients.

BRIEF DESCRIPTION OF THE DRAWINGS

FIG. 3 is a circuit diagram of a potential failure mode due to coupling of induced negative transient voltages of an output driver; and FIGS. 4A and 4B are perspective and plan views of a pinch resistor formed in an epitaxial layer, respectively.

DETAILED DESCRIPTION OF THE INVENTION

Figure 1:
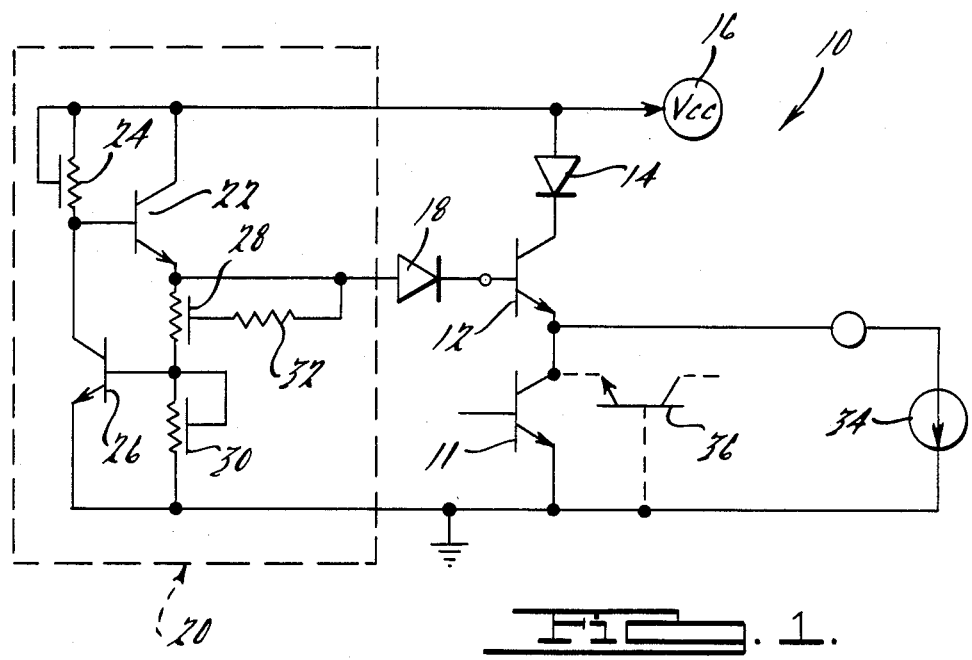
FIG. 1 is a circuit diagram of a reverse surge current protection circuit in accordance with an embodiment of this invention.

Referring to FIG. 1, a reverse voltage clamp circuit 10 is coupled to an output transistor 11. A clamping transistor 12 has an emitter connected to the collector of transistor 11 and a collector connected to a diode 14. The other end of diode 14 is connected to a voltage source 16. A diode 18 is connected to the base of transistor 12. A reference voltage means 20 is coupled to diode 18, a ground reference, and voltage source 16.

Reference voltage means 20 includes a transistor 22 having a collector connected to a voltage source 16. A pinch resistor 24 is connected between the collector and the base of transistor 22. A transistor 26 has a collector connected to the base of transistor 22 and an emitter connected to the ground reference. A pinch resistor 28 is connected between the emitter of transistor 22 and the base of transistor 26. A pinch resistor 30 is connected between the base of transistor 26 and the ground reference. A resistor 32 is connected between the emitter of transistor 22 and the "plate" of pinch resistor 28.

In operation, reference voltage means 20 applies a voltage approximately equal to two base-emitter drops, $2V_{BE}$, at diode 18. Reference voltage means 20 is a low impedance voltage source and thus can maintain that voltage even when the emitter of transistor 12 is driven toward ground.

Since the base-emitter junction of transistor 26 is in parallel with resistor 30, the voltage drop across resistor 30 is equal to the voltage drop from the emitter to the base of transistor 26. Resistor 28 is chosen approximately equal to resistor 30 so that in effect there is a voltage divider and the voltage across resistor 28 equals the voltage across the resistor 30, that is, approximately equal to the base-emitter voltage drop of transistor 26 so that the voltage at the emitter of transistor 22 is two times the base-emitter voltage drop of transistor 26, $2V_{BE}$.

Resistor 24 provides approximately 250 micro amps of bias current within reference voltage means 20. It provides both collector current for transistor 26 and base drive for transistor 22. Assuming that the base current of transistor 26 is negligible compared with the current in the branch of resistor 30, the current through resistors 30 and 28 is approximately equal. In a typical circuit, this is a good assumption since the base current of transistor 26 is approximately equal to 250 micro amps divided by 100 or 2.5 micro amps. The current through resistor 30 is approximately $V_{BE}$ divided by 2.5K or 0.65 volts divided by 2.5K or 260 micro amps.

Transistor 22 is an emitter follower which provides the bias current to resistors 28 and 30, as well as the base current to transistor 12 through diode 18 when the voltage at the output, the collector of transistor 11, drops below approximately 0.1 volts. In accordance with this invention, even when transistor 12 and diode 18 are off, there is still some idle current through transistor 22, which improves the transient response of the surge protection circuit when the output is pulled below ground. When normal current toward the collector of transistor 11 flows in load 34, transistor 12, diodes 18 and 14 are all reverse biased and nonconducting. Transistors 22 and 26 are both on and generating a reference voltage of 2 $V_{BE}$ at the emitter of transistor 22.

When a negative surge does occur, diode 18 and transistor 12 turn on, providing a low impedance clamp at the output to approximately 0 volts. This prevents the emitter-base junction of the parasitic NPN transistor 36 shown from forward biasing and turning it on. This is because diode 18 and the base emitter junction of transistor 12 provide a total voltage drop of 2 $V_{BE}$ so that the voltage supplied by the emitter of transistor 22 is brought down to a ground potential at the emitter of transistor 12. The diodes 18 and 14 can be formed of base type diffusions into the epitaxial layer. These collector-base diodes have high reverse breakdown voltages, such as 40-50 volts and protect the circuit from positive electrostatic discharge. This is desirable because the base emitter junction of transistor 12 only provides a breakdown voltage of about 7 volts. With only a 7 volt breakdown the voltage at the emitter of transistor 12 could not swing much more than about 7 volts above the voltage of power supply 16 without causing a breakdown of the base emitter junction of transistor 12. However, since it is desirable to be able to have a voltage greater than the power supply voltage 16 at the emitter of transistor 12, a higher breakdown diode is necessary in the collector of transistor 12. Resistor 32 from the emitter of transistor 22 to the "plate" of pinch resistor 28 is for the purpose of limiting current in the case of positive electrostatic discharge applied to the output, causing junction breakdown in the path through transistor 12, diode 18, resistor 28 and transistor 26. Resistor 32 is typically formed of several squares of epitaxial material, and is not necessary if resistors 28 and 30 are formed so as to have a high breakdown voltage.

Figure 2:
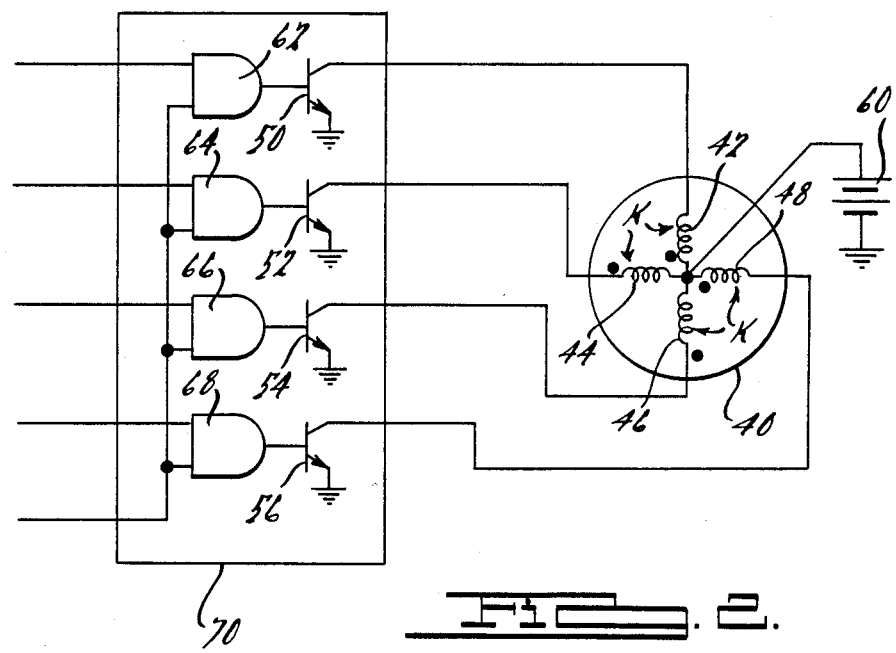
FIG. 2 is a circuit diagram of a driver with which a reverse surge current protection circuit can be used.

Referring to FIG. 2, a stepper motor 40 has coils 42, 44, 46 and 48 driven by output transistors 50, 52, 54, and 56, respectively. A battery voltage 60 is applied at the central connection of coils 42, 44, 46 and 48. A driving current is applied through logic units 62, 64, 66 and 68 to transistors 50, 52, 54 and 56, respectively. Transistors 50, 52, 54 and 56 and logic units 62 through 68 are collectively referred to as a quad driver 70. The circuitry of FIG. 1 can be connected to the circuitry of FIG. 2 in a way so that transistor 11 of FIG. 1 would be replaced by any one of output transistors 50 through 56. It is desirable that quad driver 70 be able to withstand /reverse surges at the collectors of transistors 50, 52, 54 and 56 without causing outputs that are off to turn on.

This problem is particularly undesirable when quad driver 70 is used to drive stepper motor 40. Stepper motor 40 can apply negative transients, induced by the coupling between adjacent windings on the stepper motor, to the outputs of quad driver 70. The magnitude and direction of this coupling is such that large positive transients on the collector of transistor 50, which will occur as winding 42 is switched off during normal operation, are coupled through winding 44, as large negative transients, to the collector of transistor 52. Similarly, transients on coil 46 are coupled to coil 48.

Referring to FIG. 3, there is shown a more detailed schematic indicating a potential failure mode when negative surge transients occur in an output which is supposed to be off. Associated with output transistors 80 and 82 is a parasitic NPN transistor such as transistor 84 for transistor 82. The emitter of transistor 84 is the N-type collector of the output device 82, the base of transistor 84 is the grounded P-type substrate of the entire chip, and the collector or collectors of transistor 84 are the N-type epitaxial base regions of the lateral PNP devices 86, 88 and 90. If the output voltage of transistor 82 at the collector drops to 1 $V_{BE}$ (approximately 0.6 volts at room temperature) below ground, the parasitic NPN transistor 84 turns on. Then it is possible that many of the lateral PNP's (such as 86, 88 and 90) across the entire semiconductor integrated circuit are activated or turned on because of the base current provided by the parasitic NPN transistor 84. Turning on lateral PNP's 86, 88 and 90 which are supposed to be off could then turn on output transistors such as 80 when they are supposed to be off, resulting in stepper motor malfunction. The waveforms at the collectors of transistors 82 and 80 indicate that switching transients at the collector of transistor 80 are coupled by the stepper motor to the collector of transistor 82 in a manner which tends to turn on parasitic transistor 84.

Simulations have shown the circuit of FIG. 1 to be effective in clamping reverse surge currents as great as 100 mA, with rise times as fast as 100 nsec, over the temperature extremes from $-40°$ C. to $+150°$ C.

Referring to FIG. 4A, there is shown a perspective cross section of the structure of a base pinch resistor such as 24 (FIG. 1). A P-type substrate 51 has thereon an N-type epitaxial layer 53. A tub of P-type conductivity material 55 is positioned in layer 53. An N+ layer 57 is overlaid on the P-type region 55, overlapping into the N-type epitaxial layer 53 on both sides so as to form a pinch resistor. Connections 59 and 61 are made to the ends of resistive P-type region 55. One of the connections for resistors 24 and 30 to the end of the P-type region 55 is also made to N-type region 53. For resistor 28, the connection to the N-type material has therein a resistor 32 as indicated by a dashed line in FIG. 4A. FIG. 4B is a plan view of the drawing in FIG. 4A.

Various modifications and variations will no doubt occur to those skilled in the arts to which this invention pertains. For example, the particular configuration of the reference voltage means may be varied from that disclosed herein. Also, the polarities of the transistors may be reversed so as to clamp a voltage substantially above or below a ground reference. These and all other variations which basically rely on the teachings through which this disclosure has advanced the art are properly considered within the scope of this invention.

We claim:

1. A reverse voltage clamp circuit for preventing the collector voltage of an output transistor from substantially crossing a voltage reference near ground potential, said reverse voltage clamp circuit being adapted to be coupled to a voltage source and including:

a first clamping transistor having an emitter coupled to the collector of said output transistor;

a first diode coupled to the base of said clamping transistor; and a reference voltage means coupled to the voltage source and to said first diode for establishing a reference voltage at the input to said first diode so as to keep the collector potential of said output transistor from substantially crossing the voltage reference near ground potential.

2. A reverse voltage clamp circuit as recited in claim 1 further comprising:

a second diode coupled to the collector of said clamping transistor and adapted to be coupled to the voltage source.

3. A reverse voltage clamp circuit as recited in claim 2 wherein said reference voltage means includes:

a second transistor having a collector adapted to be coupled to the voltage source and an emitter coupled to said first diode;

a first resistor coupled between the base and the collector of said second transistor;

a third transistor having a collector coupled to the base of said second transistor and an emitter coupled to the ground potential;

a second resistor coupled between the emitter of said second transistor and the base of said third transistor;

a third resistor coupled between the base of said third transistor and the ground potential;

a fourth resistor coupled between said first diode and second resistor; and said reference voltage means being adapted to establish a voltage approximately equal to the voltage drop across two base-emitter junctions of a transistor at said first diode, thereby preventing the emitter of said first clamping transistor from having a voltage substantially below the ground potential.

4. A reverse voltage clamp circuit as recited in claim 3 wherein:

said first, second and third resistors are pinch resistors formed by a region of a first conductivity type positioned between two regions of a second conductivity type.

5. A reverse voltage clamp circuit as recited in claim 4 wherein said first and third resistors have one portion of said region of said first conducting type at the same potential as an adjacent region of said second conductivity type.

6. A reverse voltage clamp circuit as recited in claim 5 wherein the second conductivity type of said second resistor is coupled to said fourth resistor.

7. A reverse voltage clamp circuit for preventing the collector of an output transistor from substantially crossing a reference voltage near ground potential, the collector of the output transistor being formed of an N-type conductivity epitaxial layer of an integrated circuit, said reverse voltage clamp circuit comprising:

a first NPN clamping transistor having an emitter coupled to the collector of the output transistor;

said first NPN clamping transistor having a collector adapted to be coupled to a voltage source;

a first diode having a cathode coupled to the base of said clamping transistor; and a reference voltage means coupled to said voltage source and to ground potential for keeping the potential at the collector of said output transistor from substantially crossing a reference potential nearthe ground potential.

8. A reverse voltage clamp circuit as recited in claim 7 further comprising:

a second diode coupled between said clamping transistor and the voltage source and having a cathode coupled to the collector of said clamping transistor and an anode adapted to be coupled to the voltage source.

9. A reverse voltage clamp circuit as recited in claim 8 wherein said reference voltage means includes:

a second NPN transistor having a collector adapted to be coupled to the voltage source and an emitter coupled to said first diode;

a first P-type pinch resistor with end terminals coupled between the base and the collector of said second transistor and with an N-type plate terminal coupled to the collector of said second transistor;

a third NPN transistor having a collector coupled to the base of said second transistor and an emitter coupled to the ground potential;

a second P-type pinch resistor with end terminals coupled between the emitter of said second transistor and the base of said third transistor, and with an N-type plate terminal;

a third P-type pinch resistor with end terminals coupled between the base and the emitter of said third transistor;

a fourth N-type epitaxial resistor coupled between the emitter of said second transistor and the plate terminal of said second P-type pinch resistor; and said second and third resistors having substantially the same magnitude so that there is established a reference voltage of about two times the voltage drop across the base-emitter junction of said third transistor at the anode of said first diode so as to keep the collector of said output transistor at or above ground.

10. A reverse voltage circuit as recited in claim 9 wherein said first and second diodes are base-collector junctions.

* * * * *